United States Patent [19]

Tachita et al.

[11] Patent Number: 4,800,577
[45] Date of Patent: Jan. 24, 1989

[54] GPS RECEIVER

[75] Inventors: Ryobun Tachita, Kawasaki; Ken Ikeda, Musashino; Akio Teranishi, Ebina, all of Japan

[73] Assignee: Matsushita Electric Industrial Co., Ltd., Kadoma, Japan

[21] Appl. No.: 78,247

[22] Filed: Jul. 6, 1987

[30] Foreign Application Priority Data

Jul. 7, 1986 [JP] Japan ................................ 61-159048
Jul. 7, 1986 [JP] Japan ................................ 61-159054

[51] Int. Cl.4 .............................................. H04L 7/10
[52] U.S. Cl. .................................... 375/115; 375/94; 392/417; 370/104
[58] Field of Search ...................... 375/97, 98, 103, 94, 375/111, 114, 115, 118; 342/357, 417, 418, 442, 450, 451; 364/443, 455; 370/104

[56] References Cited

U.S. PATENT DOCUMENTS

| 4,426,712 | 1/1984 | Gorski-Popiel | 375/115 X |
| 4,445,118 | 4/1984 | Taylor et al. | 342/357 |
| 4,457,006 | 6/1984 | Maine | 375/97 X |
| 4,575,861 | 3/1986 | Leureault | 375/115 X |
| 4,578,678 | 3/1986 | Hurd | 342/418 X |
| 4,644,358 | 2/1987 | Sekine | 342/357 X |
| 4,651,327 | 3/1987 | Fujita | 375/115 X |
| 4,701,934 | 10/1987 | Jasper | 342/357 X |

OTHER PUBLICATIONS article by G. L. Bjornsen et al; GDM/GPS Receiver Hardware Implementation; Neacon 77 pp. 303-309, 1977.
article by Charles R. Johnson et al; Application of a multiplexed GPS user set; Global Positioning System; vol. II, 1984, pp. 61-77.

Primary Examiner—A. D. Pellinen
Assistant Examiner—Derck S. Jennings
Attorney, Agent, or Firm—Spencer & Frank

[57] ABSTRACT

A GPS receiver comprising a pseudonoise generator for simultaneously generating pseudonoise signals respectively corresponding to satellite electromagnetic waves transmitted from two or more satellites, an oscillator for simultaneously regenerating carrier waves of the plurality of satellite electromagnetic waves, and a plurality of demodulators responsive to the regenerated carrier waves and the pseudonoise signals to demodulate individual satellite electromagnetic waves independently, to thereby regenerate data transmitted from individual satellites, each demodulator being operative, during demodulation, to detect a set of phases of one pseudonoise signal and one regenerated carrier wave relative to one satellite electromagnetic wave on time division basis and including a first mixer for mixing of one pseudonoise signal, a second mixer for mixing of one regenerated carrier wave and a filter, whereby a set of phases of one pseudonoise signal and one regenerated carrier wave is changed to another set at timed relationship with transmission of data from individual satellites to measure a phase of one pseudonoise signal relative to one satellite electromagnetic wave, thereby tracking data transmitted from individual satellites on the basis of the measured phase.

11 Claims, 10 Drawing Sheets

GPS RECEIVER

BACKGROUND OF THE INVENTION

This invention relates to a GPS (Global Positioning System) receiver which performs positioning by utilizing electromagnetic waves transmitted from NAVSTAR satellites constituting a global positioning satellite system.

Recently, GPS receivers have been highlighted in the field of navigation. Known as the GPS receiver are a multi-channel type receiver disclosed in, for example, "GDM/GPS Receiver Hardware Implementation", NAECON, 1977, pp 303-309 and a multiplex type receiver disclosed in, for example, "Applications of a Multiplexed GPS User Set", GLOBAL POSITIONING SYSTEM, Vol. II, 1984, pp 61-77. In these types of GPS receiver, a difference between a satellite signal and a signal generated in the receiver is constantly observed for four individual satellites and therefore the time at which each of the four satellites actually transmits an electromagnetic wave can be measured with high accuracies. With this construction, however, four demodulators (i.e, four mixers and three lowpass filters) are needed for each channel and as a result, the size of a receiver circuit is increased, leading to an expensive receiver of large size and large power consumption.

To deal with this problem, a receiver of small circuit size using a single demodulator for each channel is conceivable. But the single demodulator is switched to individual satellites at a timing predtermined for each satellite and a satellite signal from each satellite can not be acquired at a desired timing, with the result that it is very difficult to accurately acquire a timing for transmission of data from a satellite. At an instant, only one satellite is permitted to be observed and it takes a long time (such as of about four times of that in the multi-channel system) to track a satellite signal. Further, two numerical control oscillators are always required.

SUMMARY OF THE INVENTION

The present invention contemplates elimination of disadvantages encountered in the prior art GPS receivers and has for its object to provide a compact and inexpensive GPS receiver of low power consumption which can easily acquire the data transmission timing and can reduce time required for tracking satellite signals.

According to one aspect of the invention, there is provided a GPS receiver comprising a pseudonoise generator for simultaneously generating pseudonoise signals respectively corresponding to satellite electromagnetic waves transmitted from two or more satellites, an oscillator for simultaneously regenerating carrier waves of the plurality of satellite electromagnetic waves, and a plurality of demodulators responsive to the regenerated carrier waves and the pseudonoise signals to demodulate individual satellite electromagnetic waves independently, to thereby regenerate data transmitted from individual satellites, each demodulator being operative, during demodulation, to detect a set of phases of one pseudonoise signal and one regenerated carrier wave relative to one satellite electromagnetic wave on time division basis and including a first mixer for mixing of one pseudonoise signal, a second mixer for mixing of one regenerated carrier wave and a filter, whereby a set of phases of one pseudonoise signal and one regenerated carrier wave is changed to another set at timed relationship with transmission of data from individual satellites to measure a phase of one pseudonoise signal relative to one satellite electromagnetic wave, thereby tracking data transmitted from individual satellites on the basis of the measured phase.

According to another aspect of the invention, there is provided a GPS receiver comprising a pseudonoise generator for simultaneously generating pseudonoise signals respectively corresponding to satellite electromagnetic waves transmitted from two or more satellites, an oscillator for simultaneously regenerating carrier waves of the plurality of satellite electromagnetic waves, and a plurality of demodulators responsive to the regenerated carrier waves and the pseudonoise signals to demodulate individual satellite electromagnetic waves independently, to thereby regenerate data transmitted from individual satellites, the receiver further comprising a controller for supplying a clock signal of fixed period to the pseudonoise generator, delivering a phase of pseudonoise code which is quantized and complies the data, calculating a phase of the pseudonoise signal relative to the satellite electromagnetic wave with an accuracy of less than a quantized step of the phase quantization on the basis of a correlation of an output signal of the demodulator to the satellite electromagnetic wave, and numerically tracking individual pseudonoise codes specific to individual satellites.

DESCRIPTION OF THE PREFERRED EMBODIMENTS

Figure 1:
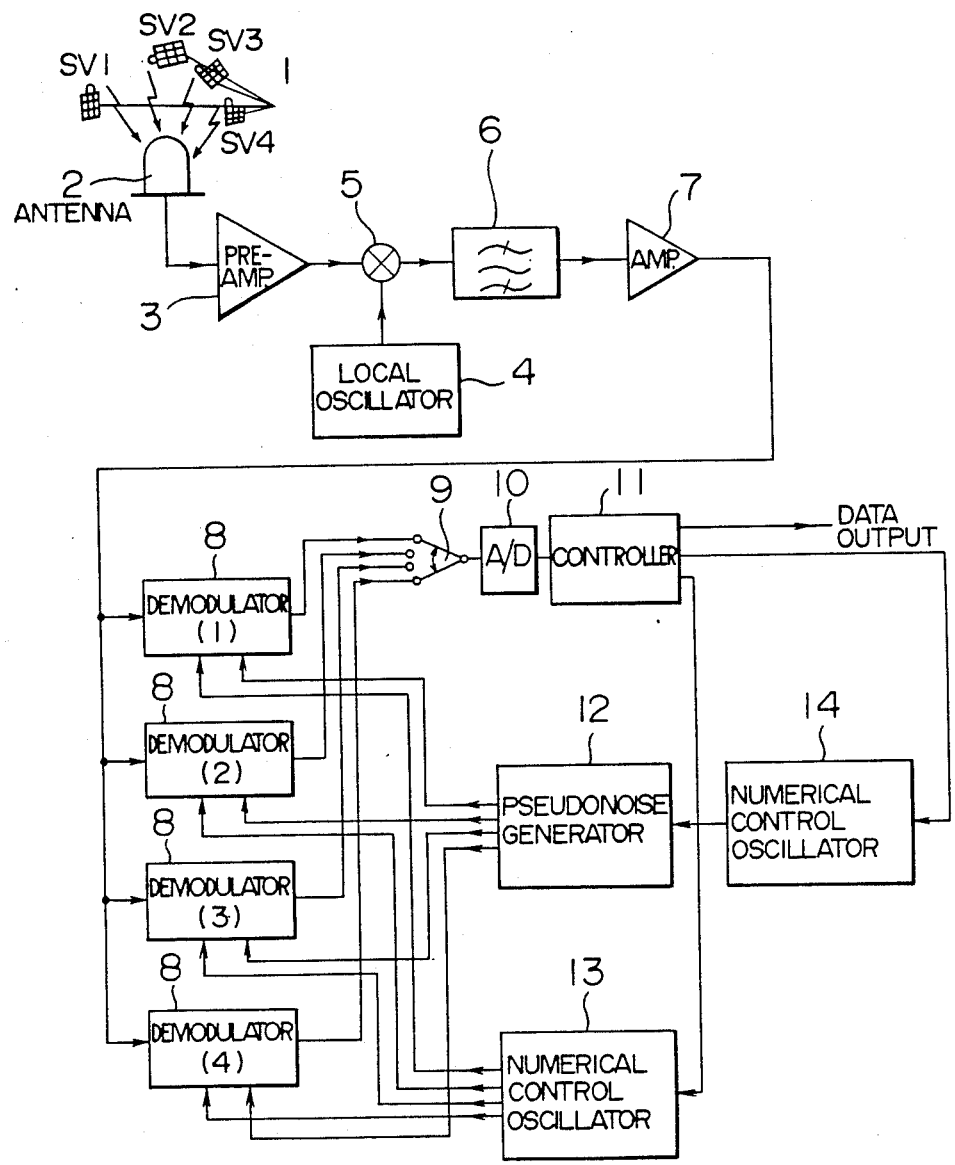
FIG. 1 is a block diagram showing a GPS receiver according to a first embodiment of the invention.

Referring now to FIG. 1, there is illustrated, in block form, a GPS receiver according to a first embodiment of the invention.

The GPS receiver comprises an antenna 2 for receiving electromagnetic waves from four satellites 1 (respectively represented by SV1 to SV4), a pre-amplifier 3 for amplifying received satellite signals, a local oscillator 4 and a mixer 5 both adapted for frequency conversion of an output signal from the pre-amplifier 3, a band-pass filter 6 for filtering an intermediate frequency signal from an output signal delivered out of the mixer 5, an amplifier 7 for amplifying an output signal of the band-pass filter 6, four demodulators 8 (respectively represented by 8-(1) to 8-(4) for demodulating a signal delivered out of the amplifier 7, a switch 9 for sequentially switching output signals of the demodulators 8 to select respective demodulators 8-(1) to 8-(4), an A/D converter 10 for sequentially receiving output signals from the demodulators 8 through the switch 9 to perform sequential analog to digital conversion of these signals, a controller 11 for controlling, in accordance with a digital signal delivered out of the A/D converter 10, numerical control oscillators 13 and 14 to be described later and calculating a position of the GPS receiver to provide position data, and a pseudonoise generator 12 for generating pseudonoise codes specific to the four individual satellites under reception. The numerical control oscillator 13 supplies regenerated carrier waves for the four individual satellites to the demodulators 8 so that the regenerated carrier waves may be used for demodulation of the received satellite signals. The numerical control oscillator 14 supplies timing signals to the pseudonoise generator 12 so that the pseudonoise codes may be delivered out of the pseudonoise generator 12 at timed relationship with the received satellite signals from the four individual satellites.

Figure 2:
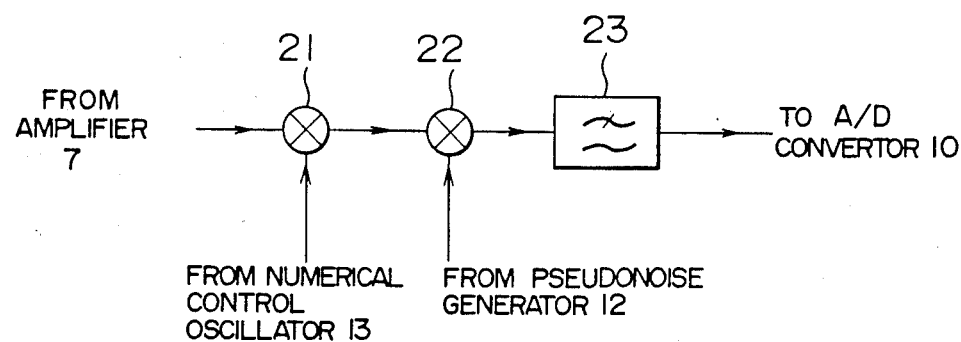
FIG. 2 is a block diagram of a demodulator used in the FIG. 1 receiver.

Details of each of the demodulators 8-(1) to 8-(4) are illustrated in FIG. 2.

Referring to FIG. 2, each demodulator 8 comprises a mixer 21 for mixing the output signal of the amplifier 7 and the output signal of the numerical control oscillator 13, a mixer 22 for mixing an output signal from the mixer 21 and the output signal of the pseudonoise generator 12, and a low-pass filter 23 for passing only a low frequency signal component of a demodulated signal delivered out of the mixer 22.

In operation, electromagnetic waves from the four satellites SV1 to SV4 are received by a non-directional antenna 2 and amplified at the pre-amplifier 3. An amplified signal from the pre-amplifier 3 is mixed with an output signal from the local oscillator 4 at the mixer 5 to perform frequency conversion of the received satellite signal. A frequency converted signal is applied to the band-pass filter 6 so as to be removed of unwanted components. Since the filter 6 has a frequency band width of 2 MHz, a signal modulated with a Gold code produced from a clock of 1.023 MHz, that is, with a C/A code can pass through the filter 6 without suffering distortion. The output signal of the filter 6 is amplified at the amplifier 7 whose gain is controlled by the controller 11 such that the dynamic range of the amplifier 7 is widened. The amplified signal contains signals transmitted from all the satellites and received by the antenna 2. This output signal from the amplifier 7 is mixed with the carrier waves regenerated at the numerical control oscillator 13 to cause the received signal to fall within a ground band. Then a correlation between the thus mixed signal and the gold code equivalent to the pseudonoise code specific to the individual satellites generated from the pseudonoise generator 12 is determined at the mixer 22. Different Gold codes are used for identification of the satellites. The output signal of the mixer 22 is passed through the low-pass filter 23 of a cut-off frequency of 1 KHz to provide demodulated data signals of 50 bps. The satellite signals transmitted form the four satellites are demodulated independently of each other at the demodulators 8-(1) to 8-(4). The regenerated output signals delivered out of the low-pass filter 23 are sequentially passed through the switch 9 transferable at a period of 100 sec and are sequentially subjected to analog to digital conversion at the A/D converter 10. The controller 11 is responsive to the output signals of the A/D converter 10 to detect phases of the pseudonoise and regenerated carrier wave relative to the satellite signal, thereby controlling the numerical control oscillators 13 and 14 to perform tracking. The controller 11 can detect the signal receiving process a time at which each satellite transmitted the electromagnetic wave and further can read out from transmitted data the respective space vehicle's ephemeris. A three-dimensional position where the antenna 2 is installed can be thus determined.

Figure 3:
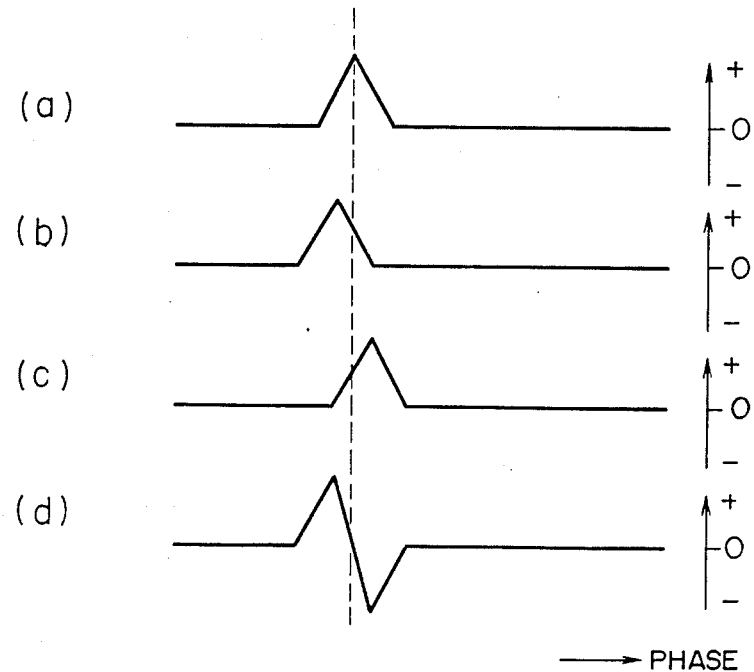
FIG. 3 illustrates at sections (a) through (d) correlation waveforms of pseudonoise signals appearing in the FIG. 1 receiver.

FIG. 3 is useful to explain the relation between the phase of a pseudonoise code and the output signal from filter 23, where the abscissa represents the phase of a pseudonoise code generated from the pseudonoise generator 12 in terms of a phase difference from a satellite signal and the ordinate represents an output signal from the low-pass filter 23. Illustrated at section (a) in FIG. 3 is a correlation output signal (correlation result) with respect to the pseudonoise code with $\tau=0$. The sign of the signal is inverted in accordance with transmitted data, so that data can be read out from the change of the sign. Illustrated at (b) in FIG. 3 is an output signal correlated to a satellite signal having a phase $\tau$, relative to the center phase of the pseudonoise code generated from the pseudonoise generator 12, which is $\frac{1}{2}$ chip and illustrated at (c) in FIG. 3 is an output signal correlated to a satellite signal having a phase $\tau$ which is $-\frac{1}{2}$ chip. These output signals illustrated at sections (a), (b) and (c) in FIG. 3 are of the same sign for the same data of a satellite. Absolute values of the correlated output signals for the phase $\tau$ being $\frac{1}{2}$ chip and $-\frac{1}{2}$ chip are then measured and subtracted from each other to obtain a phase difference of the pseudonoise code relative to the satellite signal which is illustrated at (d) in FIG. 3. In accordance with the phase difference indicated at (d) in FIG. 3, the controller 11 controls the oscillation frequency of the numerical control oscillator 14 to perform tracking in which that phase difference is made zero.

Figure 4:
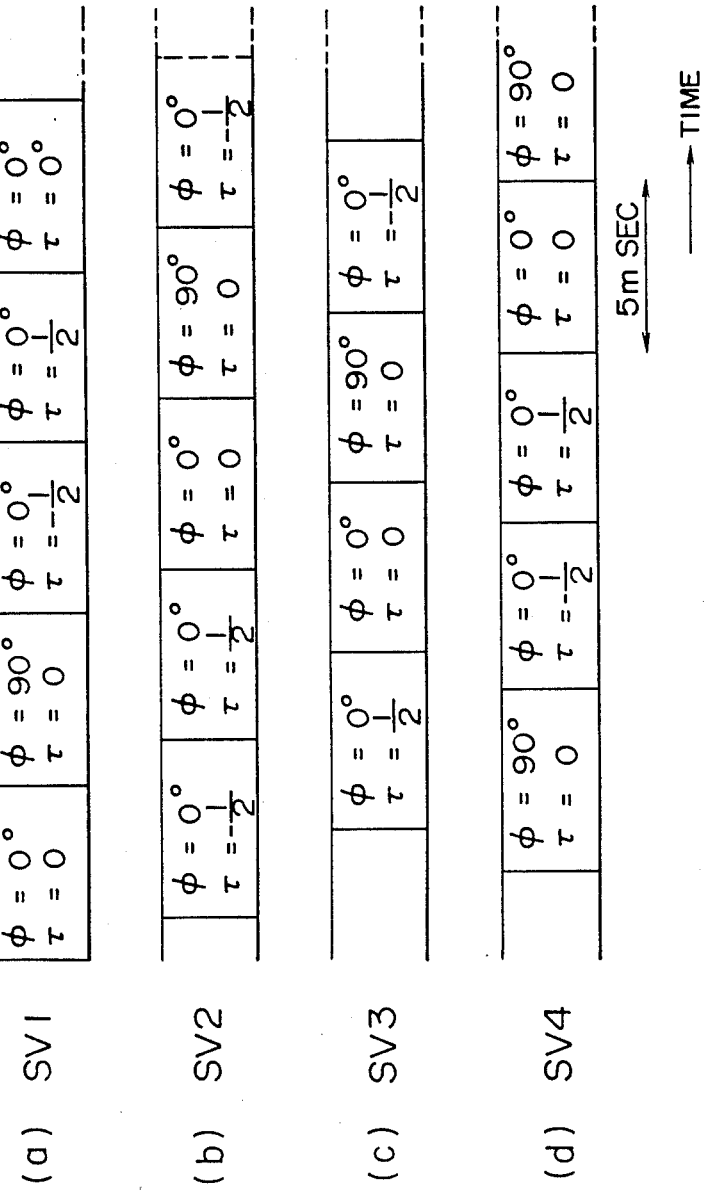
FIG. 4 illustrates at sections (a) through (d) timings for a set of phases of regenerated carrier wave and pseudonoise signal to change to another set in the FIG. 1 receiver.

FIG. 4 illustrates timings for switching the phase $\tau$ relative to the center phase of the pseudonoise generated from the pseudonoise generator 12 to zero chip, $\frac{1}{2}$ chip and $-\frac{1}{2}$ chip, and timings for switching the phase, $\phi$, of the output signal of numerical control oscillator 13 i.e., the regenerated carrier wave to 0° and 90°. It is illustrated at sections (a) to (d) that satellite signals from the individual satellites SV1 to SV4 are received by the individual demodulators 8-(1) to 8-(4) at different timings. The satellite signals leading to the output signals indicated at (a), (b) and (c) in FIG. 3 can be received at timings for $\phi=0°$ and $\tau=0$, $\phi=0°$ and $\tau=\frac{1}{2}$ and $\phi=0°$ and $\tau=-\frac{1}{2}$, respectively. A set of the phases $\phi$ and $\tau$ is changed at a period of 5 msec. The satellite signal received at the timing for $\phi=90°$ and $\tau=0$ is compared with the satellite signal received at the timing for $\phi=0°$ and $\tau=0$ to permit the controller 11 to control the numerical control oscillator 13 in which the carrier waves are regenerated.

In this manner, tracking by the carrier waves and pseudonoise codes can be carried out.

Figure 5:
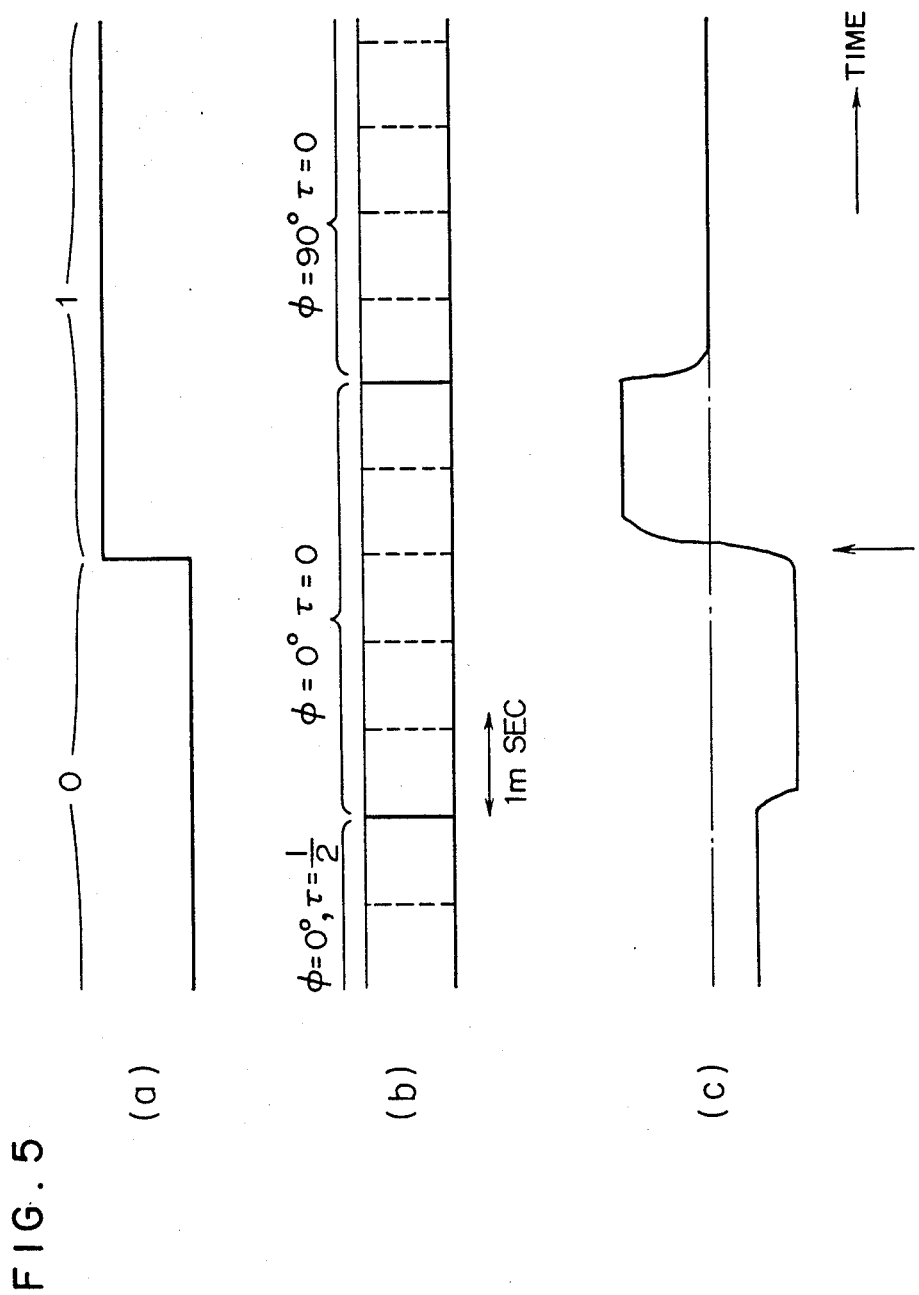
FIG. 5 is a diagram useful to explain the relation between the timing for switching the set of phases and the timing for transmitting data from a satellite.

FIG. 5 is useful to explain the relation between the timing for switching the set of phases $\phi$ and $\tau$ and the timing for transmitting data from the satellite. The data transmission is carried out at a period of 20 msec which is exactly synchronous with a period of 1 msec at which the pseudonoise code is generated. Illustrated at (a) in FIG. 5 is a timing for transition of the transmitted data from "0" to "1". Acquisition of this timing is important for knowing the time at which an electromagnetic wave now being under reception is emitted from the satellite. Illustrated at (b) in FIG. 5 are timings for changing the set of phases $\phi$ and $\tau$ where the vertical solid lines indicate, timings at which the set of phases $\phi$ and $\tau$ changes and the dotted lines indicate the period at which the pseudonoise code is generated. At (c) in FIG. 5, the output signal from the low-pass filter 23 is illustrated, indicating that a change of the data can be acquired exactly when both the phases $\phi$ and $\tau$ are zero. It should also be noted that because the set of phases $\phi$ and $\tau$ is changed at a period of 20 msec, each timing for transition of the data can be acquired. The timings for changing the set of phases are set independently for the four individual satellites.

As is clear from the foregoing description, the first embodiment comprises the four demodulators 8 being identical in number to the satellites 1 and each being simplified in construction by including the two mixers 21 and 22 and the low-pass filter 23, whereby the set of phases of the pseudonoise code and regenerated carrier wave is changed in time sequence and the timing for changing the set of phases is synchronized with the timing for transmission of data from the individual satellites being under tracking, thereby ensuring that the timing for transition of data transmitted from the individual satellites being under tracking or, if necessary, being in track can be acquired accurately and hence the transmission timings of transmitted data from the individual satellites can be determined rapidly, that is, can be received at a one to half time of that in the case of the prior art multi-channel system. In addition, because of the very simplified construction of the demodulator 8, an inexpensive, compact and light receiver comparable to the prior art multiplex type receiver can be obtained.

Figure 6:
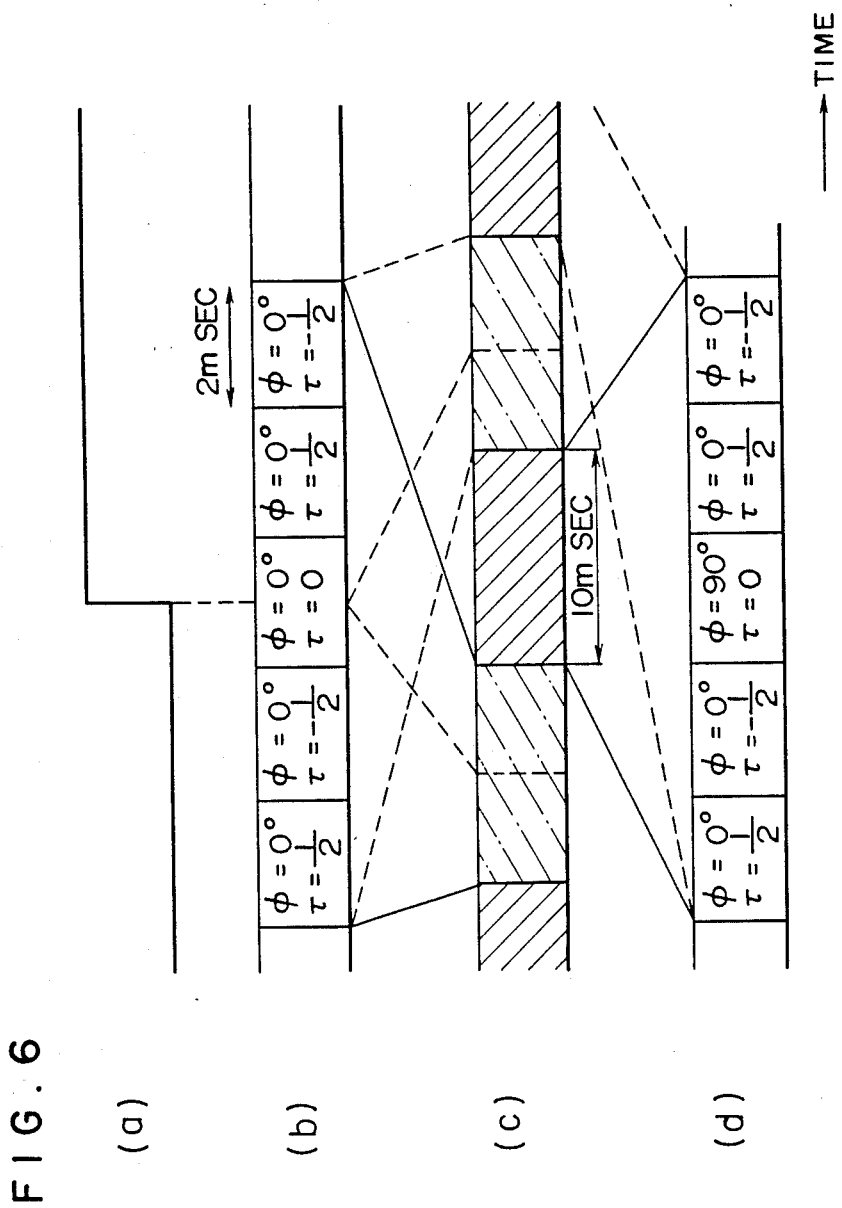
FIG. 6 illustrates timings similar to those in FIG. 4 but according to a second embodiment of the invention.

In accordance with a second embodiment of the invention, the set of phases of the pseudonoise and regenerated carrier wave is changed to another set at timings as illustrated in FIG. 6. The construction of the receiver is the same as the receiver construction in the first embodiment but the timing for phase change is different as will be described with reference to FIG. 6.

Illustrated at section (a) in FIG. 6 is a timing for inversion of data transmitted from the satellite. At (b) in FIG. 6, timings for changing the set of phases are illustrated, indicating that the set of phases is changed at a period of 2 msec. The timing for the inversion of data is synchronized with the center of the 2 msc period for $\phi=0°$ and $\tau=0$ (zero) chip. Periods of 10 msec to be seen at (a) in FIG. 6 are illustrated at (c) in FIG. 6 on a reduced scale of time axis. A period of 10 msec following the 10 msec period shown at (b) in FIG. 6 is illustrated at (d) in FIG. 6, indicating that this subsequent 10 msec period contains a set of $\phi=90°$ and $\tau=0$ (zero) chip which is used for determining the phase of the regenerated carrier wave and sets of $\phi=0°$, $\tau=\frac{1}{2}$ chip and $\phi=0°$, $\tau=-\frac{1}{2}$ chip which are used for determining the phases of the pseudonoise.

The interval at which the phases of the pseudonoise are measured has direct relation to accuracies of position measurement. In the second embodiment, the interval is decreased, making it possible to respond to large acceleration which occurs when the receiving position moves.

As described above, in the first and second embodiments, the plurality of demodulators 8 of simplified construction are used to track, on time division basis, the pseudonoise codes and regenerated carrier waves with respect to the satellite signals, whereby the individual demodulators can independently demodulate the individual satellite signals to thereby ensure that the timing at which data are transmitted from the individual satellites can be detected rapidly and easily.

Each demodulator 8 is comprised of a single circuit arrangement of FIG. 2 in the foregoing embodiments but it may comprises two of the FIG. 2 circuit arrangements. Further, the order of the mixers 21 and 22 may be reversed so that a signal obtained from mixing a pseudonoise code and a regenerated carrier wave can be mixed with a received signal.

The timing for changing the set of phases of the pseudonoise and regenerated carrier wave as explained with reference to FIGS. 4 and 6 is for illustration purpose only and is not limitative.

Figure 7:
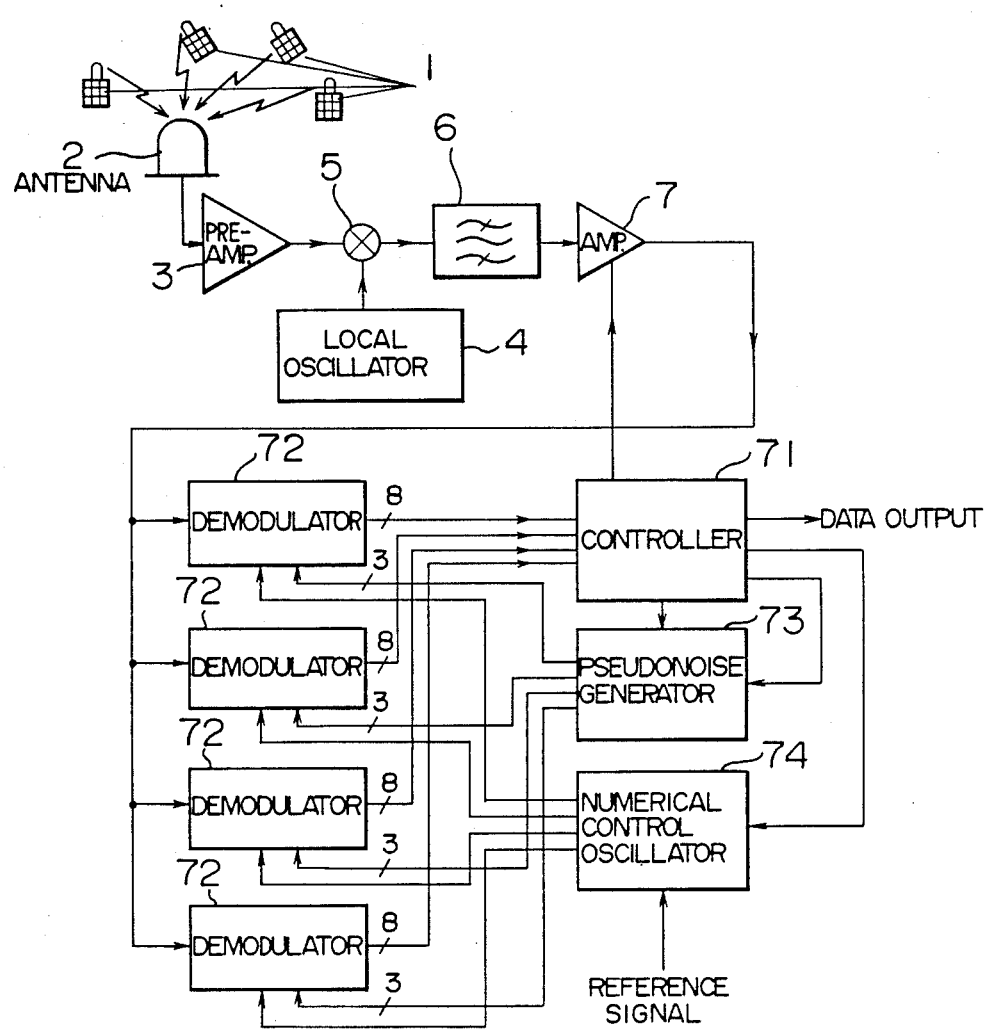
FIG. 7 is a block diagram of a GPS receiver according to a third embodiment of the invention.

Turning to FIG. 7, a third embodiment of the invention will be described.

Being different from the previous embodiments based on the FIG. 1 construction directed to simplification of the construction of demodulator 8, the third embodiment does not contain the numerical control oscillator 14 shown in FIG. 1.

A GPS receiver according to the third embodiment of the invention comprises, as diagrammatically shown in FIG. 7, an antenna 2 for receiving electromagnetic waves from four satellites 1, a pre-amplifier 3 for amplifying a received satellite signal, a local oscillator 4 and a mixer 5 both adapted for frequency conversion of an output signal delivered out of the preamplifier 3, a band-pass filter 6 of 2 MHz band width for passing only an intermediate frequency signal of a frequency converted output signal delivered out of the mixer 5, an amplifier 7 for amplifying an output signal of the band-pass filter 6, a controller 71 for controlling the receiver, demodulators 72 for demodulating and digitizing and output signal delivered out of the bandpass filter 6 to provide a demodulated digital output signal, a pseudonoise generator 73 for supplying to the demodulators 72 pseudonoise codes in the form of Gold codes specific to the four individual satellites 1, and a numerical control oscillator 74 for regenerating carrier waves used for demodulating the satellite signals subject to two-phase shift keying which are transmitted from the satellites 1.

Figure 8:
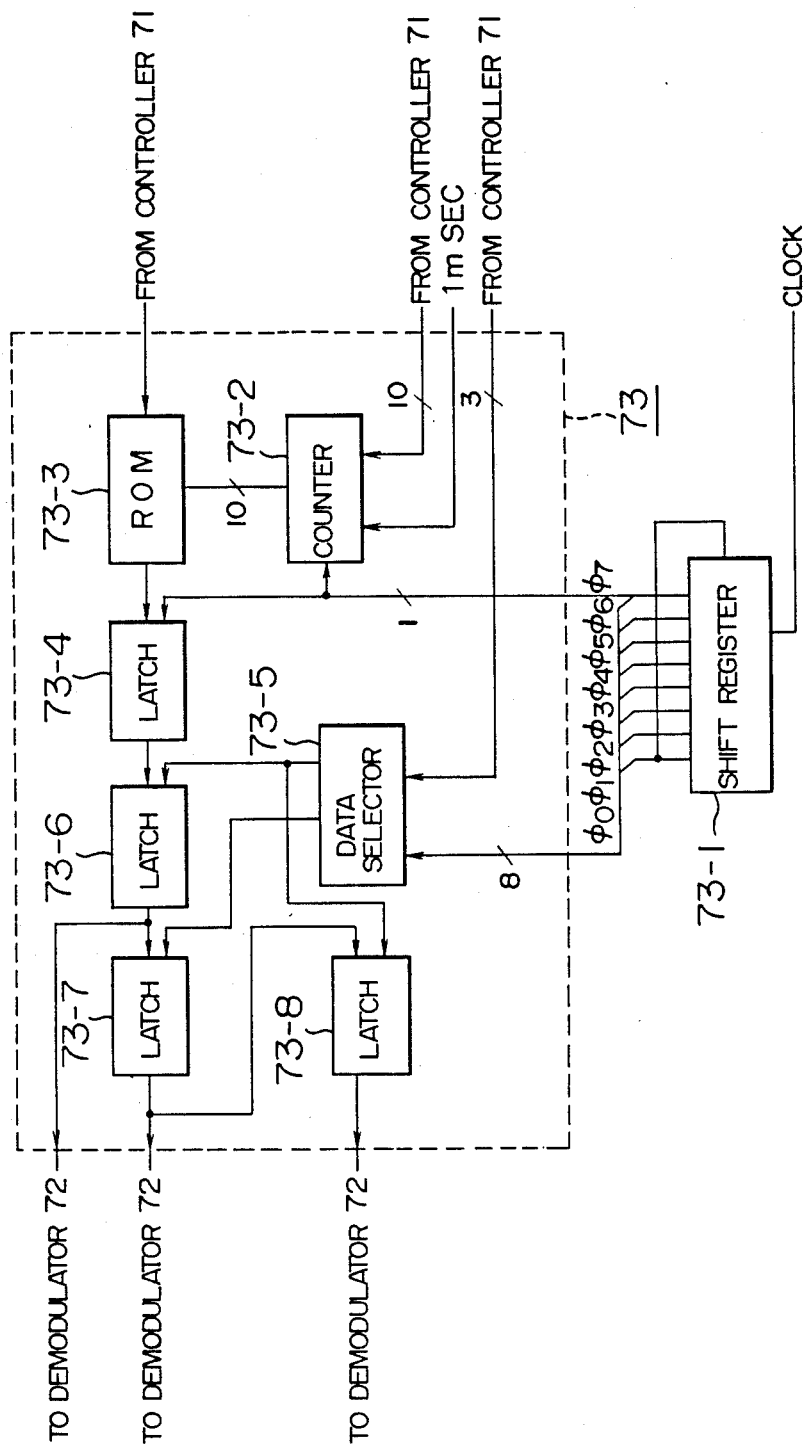
FIG. 8 is a block diagram of a pseudonoise generator used in FIG. 7 receiver.

FIG. 8 shows, in block form, details of the pseudonoise generator 73 shown in FIG. 7. More specifically, the pseudonoise generator 73 comprises a shift register 73-1 responsive to a clock of 8.184 MHz to generate eight clocks $\phi_0$ to $\phi_7$ each being of 1.023 MHz and which are equally out of phase from each other, a counter 73-2 of 1023 bits which is preset every 1 msec with a phase of pseudonoise code of 10 bits resulting from quantization with a step of 1/1023 msec and supplied from the controller 71 and which is counted up by the clock $\phi_7$, a ROM 73-3 responsive to a 10-bit count value of the counter 73-2 to produce a pseudonoise code specific of a satellite which is selected by a satellite selection signal from the controller 71, a latch 73-4 for matching the timing for an output signal from the ROM 73-3, a data selector 73-5 responsive to the lower three bits of phase data of pseudonoise code resulting from quantization with a step of 1/8184 msec and supplied from the H controller 71 to select two clocks from the clocks $\phi_0$ to $\phi_7$ delivered out of the shift register 73-1, a latch 73-6 responsive to the selected clocks to latch a pseudonoise code which leads by ½ chip (one chip being 1/1023 msec), a latch 73-7 responsive to other clocks selected differently by the data selector 73-5 to produce a pseudonoise code at the center phase, and a latch 73-8 responsive to the former selected clocks to produce a pseudonoise code which lags by ½ chip.

In operation, electromagnetic waves from the four satellites 1 are received by the non-directional antenna 2, amplified at the pre-amplifier 3 and subjected to frequency conversion at the mixer 5 which also receives the output signal from the local oscillator 4. The output signal from the mixer 5 undergoes band restriction and is then amplified at the amplifier 7. The output signal from the amplifier 7 contains all the satellite signals received by the antenna 2. Thus, all the satellite signals are separated into individual satellite signals for the individual satellites and digitized into 8-bit signals by means of the four demodulators 72. Each 8-bit signal is supplied to the controller 71. A satellite 1 can be identified by selecting, in accordance with a satellite selection signal from the controller 71, a Gold code of 1023-bit length specific to the satellite 1 in question and determining a correlation of the selected Gold code to a satellite signal under reception at a demodulator 72. Further, an oscillation output from the numerical control oscillator 74, that is, a regenerated carrier wave is also supplied to the demodulator 72 in order to respond to a Doppler shift due to a relative speed between the receiver and the satellite 1 and to demodulate the two-phase shift keyed satellite signal from the satellite 1 to thereby regenerate data. A phase of the pseudonoise code generated from the pseudonoise generator 73 and a phase of the carrier wave regenerated at the numerical control oscillator 74, these phases being relative to the satellite signal, are detected at the demodulator 72 and used by the controller 71 to track the satellite signal from the satellite 1. The controller 71 is also responsive to the output signal from the demodulator 72 to read the data transmitted from the satellite 1, space vehicle's ephemeris of the satellite 1 and GPS time indicated by the satellite 1. The thus read GPS time indicates the time that the satellite 1 emitted the electromagnetic wave. Four values of GPS time obtained in respect of the four satellites provide four values of apparent time at which electromagnetic waves were emitted from the four individual satellites, and are used as unknowns together with unknowns representative of a three-dimensional position of the receiving point in simultaneous equations established for determining the propagation time of the electromagnetic wave and a position of the satellite 1. A position calculated by solving the simultaneous equations is delivered out of the controller 71.

Figure 9:
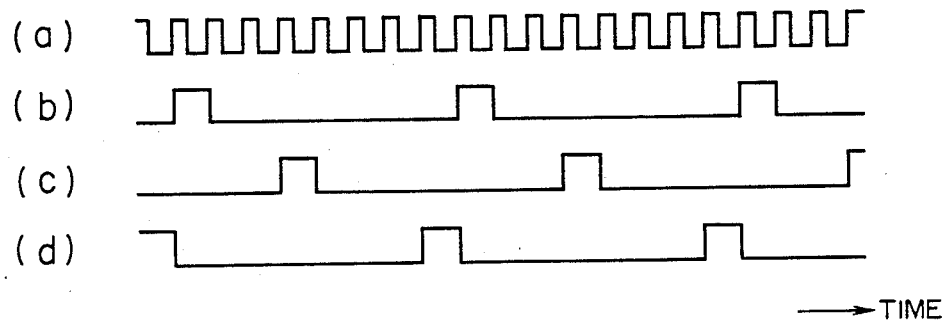
FIG. 9 illustrates clock timings appearing in the FIG. 8 generator.

The pseudonoise generator 73 will be described in greater detail with reference to FIG. 8. The pseudonoise generator 73 receives data representative of a phase of pseudonoise code of 13 bits resulting from quantization with a step of 1/8184 msec (about 120 nsec) and supplied from the controller 71. The data selector 3-5 responds to lower three bits of the data to select two clocks from the eight clocks $\phi_0$ to $\phi_7$ which are equally out of phase from each other. The selected clocks are exemplified in FIG. 9. Illustrated at (a) in FIG. 9 is the clock of 8,184 MHz and illustrated at (b) in FIG. 9 is the clock $\phi_0$. When the lower three bits of the phase data take a value "3", the data selector 73-5 supplies the clock $\phi_3$ as shown at (b) in FIG. 9 to the latches 73-6 and 73-8 and supplies the clock $\phi_7$ as shown at (c) in FIG. 9 to the latch 73-7. When the lower three bits take a value "n", the data selector 73-5 supplies a clock $\phi_n$ to the latches 73-6 and 73-8 and supplies a clock $\phi_m$ to the latch 73-7, where m is a remainder obtained when n+4 is divided by 8.

Accordingly, assuming that the center phase coincides with time that the latch 73-7 delivers a pseudonoise code, the latch 73-6 produces a pseudonoise code which leads by ½ chip (1/2046 msec) and the latch 3-8 produces a pseudonoise code which ½ chip lags. The counter 73-2 is preset at a period of 1 msec with upper ten bits of the phase data and counted up by the clock $\phi_7$, with the result that pseudonoise codes written in the ROM 73-3 are read at phases sequentially preset.

Figure 10:
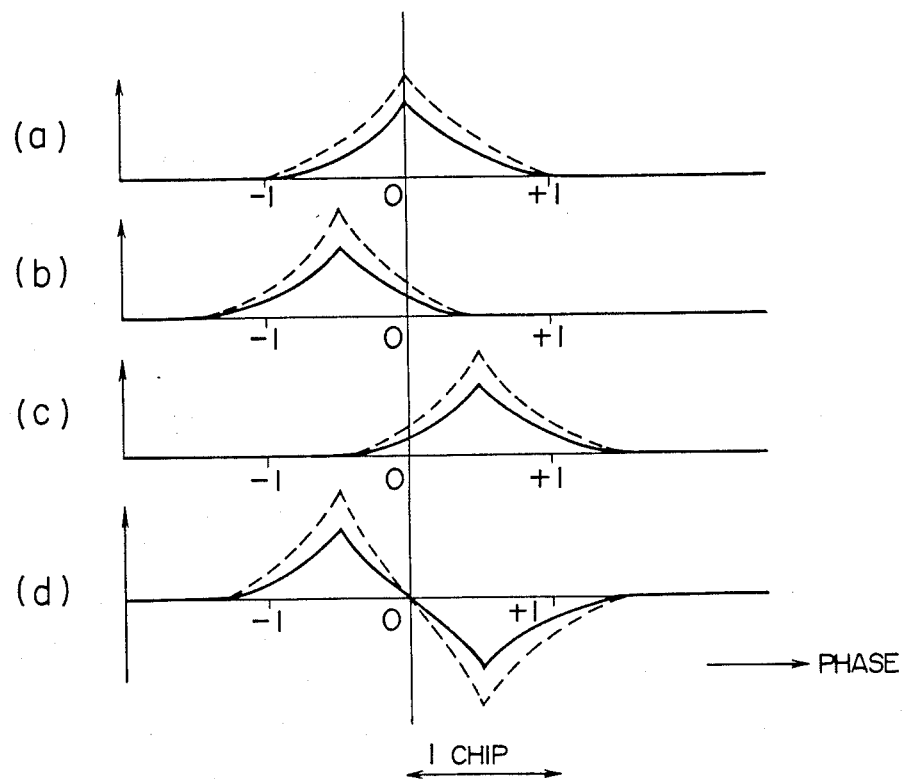
FIG. 10 illustrates at sections (a) through (d) changes in output signal from a demodulator in accordance with the phase of pseudonoise code.

The output signal of the demodulator changes as illustrated in FIG. 10 in accordance with the phase of the pseudonoise code relative to the received satellite signal. At section (a) in FIG. 10, a correlation of the pseudonoise code of the latch 73-7 to the catellite signal is illustrated in absolute value. The amplitude of the input signal to the demodulator 72 changes within a range defined by solid and dotted lines. The phase of the pseudonoise code delivered out of the latch 73-7 coincides with the satellite signal and is defined as zero. On the other hand, the lagging pseudonoise code delivered out of the latch 73-8 is correlated at the demodulator 72 to the satellite signal as illustrated at (b) in FIG. 10 and the leading pseudonoise code delivered out of the latch 73-6 is correlated at the demodulator 72 to the satellite signal as shown at (c) in FIG. 10, with the amplitude of the input signal to the demodulator 72 changing within a range defined by solid and dotted lines. A difference between the correlations as illustrated at (b) and (c) in FIG. 10 is illustrated at (d) in FIG. 10. The difference is zero when the phase $\tau$ between the satellite signal and the pseudonoise code generated from the pseudonoise generator 73 is zero. With the phase $\tau$ being 1.5 chip or less in absolute value, the sign of $\tau$ coincides with that of the difference at (d) in FIG. 10.

Assuming that the amplitude of the input signal is A, the pseudonoise code delivered out of the latch 73-7 has a correlation $K_o$ to the satellite signal which is $$K_o = \begin{cases} f\{A(1 - |\tau|)\} & ; \ |\tau| \leq 1 \\ 0 & ; \ |\tau| > 1 \end{cases} \quad (1)$$

where f {} represents an amplitude characteristic of the demodulator 72. Similarly, the leading pseudonoise code delivered out of the latch 73-6 has a correlation $K_+$ to the satellite signal which is $$K_+ = \begin{cases} f\{A(1 - |\tau - \tfrac{1}{2}|)\} & ; \ |\tau - \tfrac{1}{2}| \leq 1 \\ 0 & ; \ |\tau - \tfrac{1}{2}| > 1 \end{cases} \quad (2)$$

and the lagging pseudonoise code delivered out of the latch 73-8 has a correlation $K_-$ to the satillite signal which is $$K_- = \begin{cases} f\{A(1 - |\tau + \frac{1}{2}|)\} & ; \ |\tau + \frac{1}{2}| \leq 1 \\ 0 & ; \ |\tau + \frac{1}{2}| > 1 \end{cases} \quad (3)$$

Accordingly, the correlation $K_+$, $K_0$ and $K_-$ are monotonous functions within an interval in which the phase changes from $-\frac{1}{2}$ to 0 and from 0 to $\frac{1}{2}$. Since the phase of the pseudonoise code is quantized with a step of $\frac{1}{4}$ chip, the phase $\tau$ can be confined within $\pm \frac{1}{2}$ chip when the satellite is tacked using the pseudonoise code. Whether the phase $\tau$ is positive or negative is decided by the difference between $K_+$ and $K_-$ as illustrated at (d) in FIG. 10. Regardless of $\tau$ being positive or negative, $\tau$ and A are determined such that a value $\psi(\tau, A)$ for evaluation of the error in $\tau$ which is $$\psi(\tau, a) = [k_+ - f\{A(1 - |\tau - \frac{1}{2}|)\}]^2 + \quad (4)$$
$$[k_0 - f\{A(1 - |\tau|)\}]^2 +$$
$$[k_- - f\{A(1 - |\tau + \frac{1}{2}|)\}]^2$$

can be minimized. In equation (4), $k_+$, $k_0$ and $k_-$ are actual measurement values of $K_+$, $K_0$ and $K_-$, respectively. The sum of a value of $\tau$ obtained from the above calculation and an actually set, quantized pseudonoise code phase represents a true value of a phase of a pseudonoise code specific to a satellite 1 and is used to cause the controller 71 to track the pseudonoise code.

As is clear from the foregoing description, according to the third embodiment, the pseudonoise generator 73 is driven by the clock of a fixed period to generate the quantized phase of pseudonoise code which if used to obtain a correlation of the pseudonoise code to the received satellite signal, and pattern matching between the correlation result and the characteristic of the demodulator 72 is effected to determine the phase of the pseudonoise code relative to the satellite signal, whereby the phase can be tracked with an accuracy which is higher in calculation than the quantized phase of pseudonoise code actually set in the pseudonoise generator 73. Accordingly, the third embodiment can dispense with the numerical control oscillator 12 shown in FIG. 1 to realize an inexpensive, compact and light GPS receiver.

The clock for the pseudonoise generator is affected by a Dopper shift of the received satellite signal due to a relative speed between the satellite and the receiver and by an accuracy of the oscillator adapted to generate a reference timing and tends to differ from the clock for the pseudonoise code specific to the satellite, but errors in clock are about 4 ppm at the most and changes in quantized phases set in the pseudonoise generator by the fixed clock during the period of 1 msec can be 4 nsec or less throughout the 1 msec period. This value of change is 1.2 m or less in terms of the distance between the satellite and the measuring point and can normally be neglected. Errors in clock can be corrected easily by calculation using a clock error obtained from calculation of position.

A fourth embodiment of the invention will now be described. In the fourth embodiment, the receiver has the same construction as that shown in FIGS. 7 and 8 but the phase of pseudonoise code relative to the satellite signal is calculated in different sequence. While in the third embodiment A and $\tau$ are so determined as to minimize the equation (4), they are determined in the fourth embodiment by solving the following equation $$\begin{cases} k_+ = f\{A(1 - |\tau - \frac{1}{2}|)\} \\ k_- = f\{A(1 - |\tau + \frac{1}{2}|)\} \end{cases} \quad ; \ |\tau| \leq \frac{1}{2} \quad (5)$$

in a range wherein the absolute value of $\tau$ is smaller than $\frac{1}{2}$ chip.

The fourth embodiment is meritorious in that the phase of pseudonoise code can be determined through simpler calculation.

Figure 11:
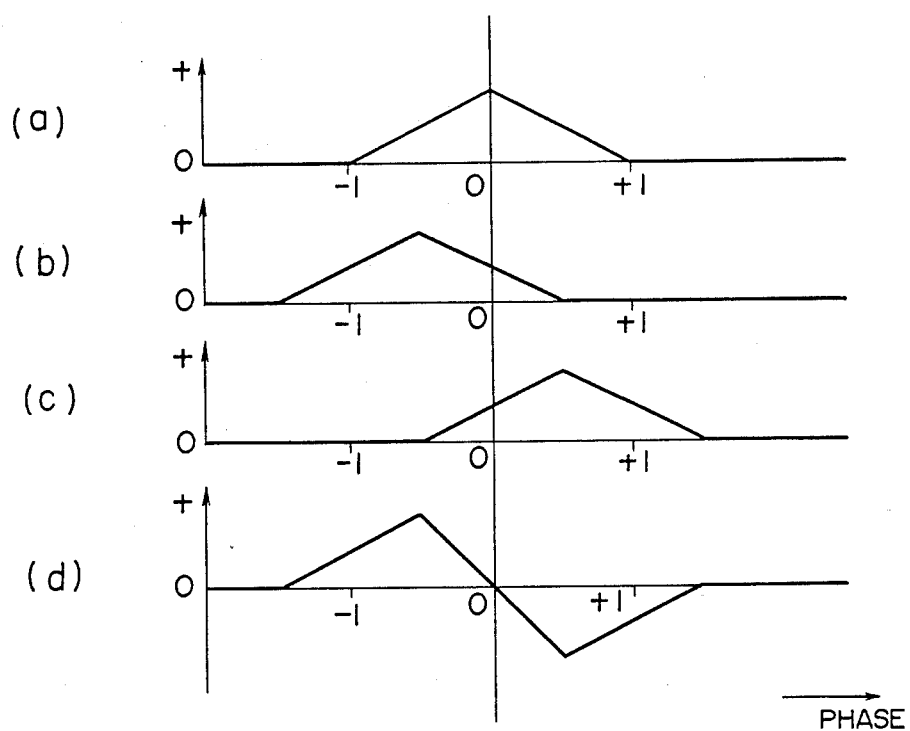
FIG. 11 is a similar diagram to FIG. 10 when a demodulator of a different characteristic is used.

A fifth embodiment of the invention will now be described. In the fifth embodiment, a receiver has the same construction as that shown in FIGS. 7 and 8 with the only exception that a mixer having a linear input/output characteristic is used in each demodulator 72 shown in FIG. 7. Because of the linear characteristic, the correlation characteristic between the pseudonoise code and the satellite signal as illustrated in FIG. 10 is changed to that shown in FIG. 11. Accordingly, equation (5) is reduced to $$\begin{cases} k_+ = A\left\{1 - \left(\frac{1}{2} - \tau\right)\right\} \\ k_- = A\left\{1 - \left(\frac{1}{2} + \tau\right)\right\} \end{cases} \quad ; \ |\tau| \leq \frac{1}{6} \quad (6)$$

and there results $$\tau = \frac{1}{2} \cdot \frac{k_+ - k_-}{k_+ + k_-} \quad (7)$$

Thus, by using the mixer having the linear characteristic, the phase of the pseudonoise code can be determined through very simplified calculation.

Although in the foregoing description the invention has been described by way of the multi-channel GPS receiver, the invention is not limited thereto and may also be applied to a single channel receiver. The preset counter 73-2 used in the pseudonoise generator 73 may be replaced with, for example, an arrangement wherein an output signal from a reference counter is added to phase data from the controller 71 and the uppermost carry signal is added to a lower digit to calculate an address or an arrangement using a RAM in place of the ROM 73-3.

The phase of the pseudonoise code, quantized with a step of $\frac{1}{4}$ chip in the foregoing embodiments, may be quantized with a broader step of $\frac{1}{2}$ chip or less but the smaller the quantization step, the more the accuracy can be improved.

Even if the demodulator 71 has a non-linear correlation characteristic, the non-linear correlation characteristic can be approximated to a linear characteristic by looking up a table so as to obtain sufficiently accurate results in calculating the phase of pseudonoise code.

Conceivably, a receiver using the construction of FIGS. 1 and 2 and the construction of FIGS. 7 and 8 in combination may be constructed as illustrated in FIG.

12, which illustrates, in block form, a GPS receiver according to a sixth embodiment of the invention.

Figure 12:
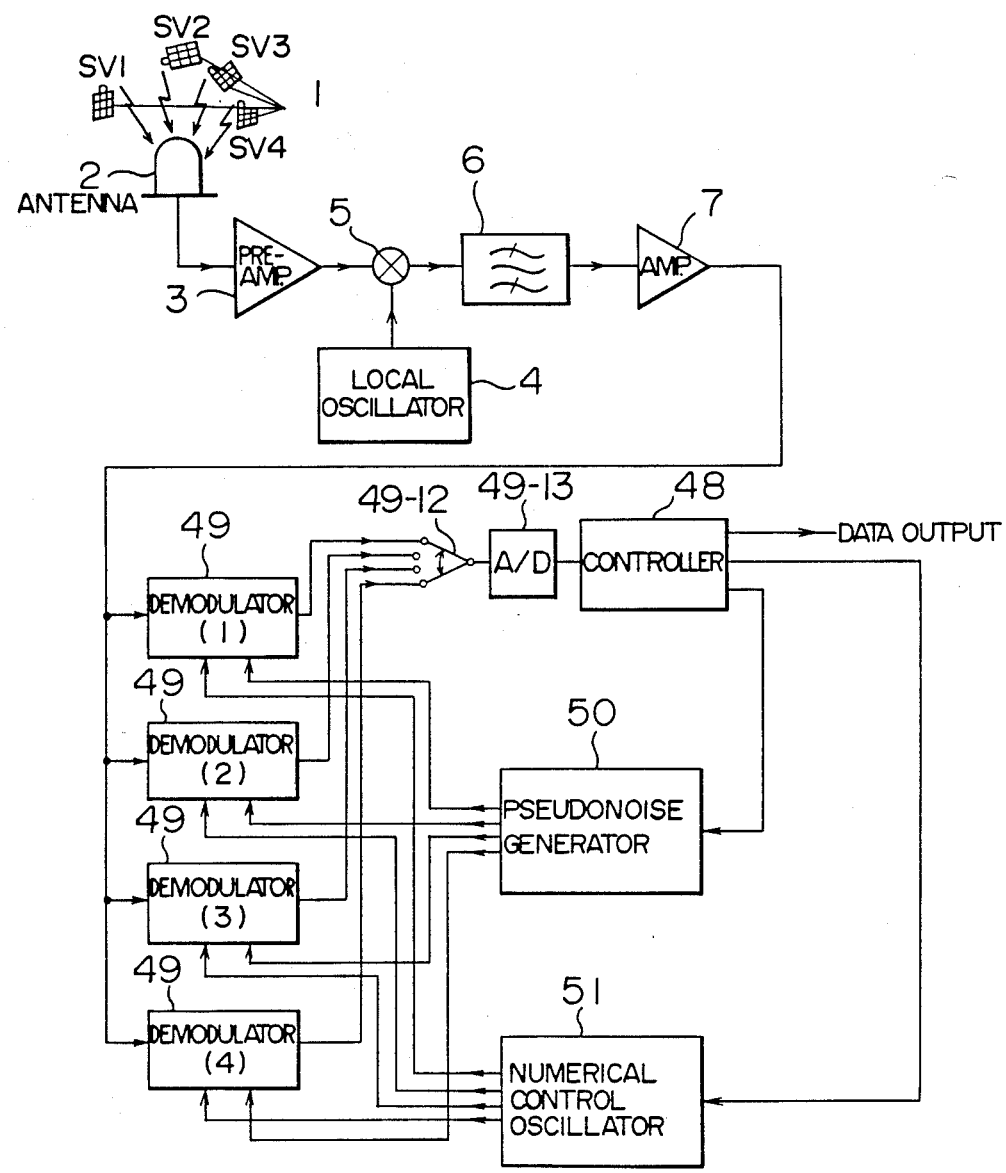
FIG. 12 is a block diagram showing a GPS receiver according to a fourth embodiment of the invention.

The GPS receiver of FIG. 12 includes an antenna 2 for receiving electromagnetic waves from four satellites 1, a pre-amplifier 3 for amplifying received satellite signals, a local oscillator 4 and a mixer 5 both adapted for frequency conversion of an output signal from the pre-amplifier 3, a band-pass filter 6 for filtering an intermediate frequency signal from an output signal delivered out of the mixer 5, an amplifier 7 for amplifying an output signal of the band-pass filter 6, four demodulators 49 for demodulating a signal delivered out of the amplifier 7, a switch 49-12 for switching to sequentially select output signals of the demodulators 49, an A/D converter 49-13 for sequentially analog-to-digital converting output signals of the demodulators 49 through the switch 49-12, and a controller 48 for controlling, in accordance with a digital signal delivered out of the A/D converter 49-13, a pseudonoise generator 50 and a numerical control oscillator 51 to be described hereinlater, and for calculating a position of the GPS receiver to provide position data. The elements 1-7, 49, 49-12, 49-13 and 48 are the same as those designated by reference numerals 1 to 11 respectively in FIG. 1. Further the pseudonoise generator 50 generates Gold codes specific to the four individual satellites 1, which form pseudonoise codes to the demodulators 49. The numerical control oscillator 51 supplies regenerated carrier waves for demodulation of bi-phase modulated transmission data from the satellite signals. The pseudonoise generator 50 and the numerical control oscillator 51 are fundamentally similar with those designated by numerals 73 and 74 in FIG. 7. The demodulator 49, pseudonoise generator 50 and numerical control oscillator 51 shown in FIG. 12 can perform like operations with those shown in FIG. 1 at the timing relationships shown in FIGS. 4 to 6. During the operations, the pseudonoise generator 50 generates pseudonoise codes of digitized phases, the operation of which is identical with that of the generator 73 shown in FIG. 7.

According to the embodiment of FIG. 12, it becomes possible to eliminate the pseudonoise generator 12 of FIG. 1 by using the demodulator 49 simplified in structure and the pseudonoise generator 50 operated by a constant period of clock signals. Thus it can realize a cheap GPS receiver which is small in size and light in weight.

We claim:

1. A GPS receiver comprising:
   pseudonoise generator means for simultaneously generating pseudonoise signals respectively corresponding to satellite electromagnetic waves transmitted from two or more satellites;
   oscillator means for simultaneously regenerating carrier waves of the plurality of satellite electromagnetic waves; and
   a plurality of demodulator means responsive to said regenerated carrier waves and said pseudonoise signals to demodulate individual satellite electromagnetic waves independently, to thereby regenerate data transmitted from individual satellites;
   each demodulator means being operative, during demodulation, to detect a set of phases of one pseudonoise signal and one regenerated carrier wave relative to one satellite electromagnetic wave on time division basis and including a first mixer for mixing of one pseudonoise signal, a second mixer for mixing of one regenerated carrier wave and a filter, whereby a set of phases of one pseudonoise signal and one regenerated carrier wave is changed to another set at timed relationship with transmission of data from individual satellites to measure a phase of one pseudonoise signal relative to one satellite electromagnetic wave, thereby tracking data transmitted from individual satellites on the basis of the measured phase.

2. A GPS receiver according to claim 1, wherein the phase of the pseudonoise signal generated from said pseudonoise generator means is changed to a center phase, a leading phase and a lagging phase, the phase of the regenerated carrier wave is sequentially changed to an in-phase and a quadrature phase at said center phase, and transition of data is transmitted from the satellite at timed relationship with the vicinity of the center of a period during which the phase of the pseudonoise signal takes the center phase and the phase of the regenerated carrier wave takes the in-phase.

3. A GPS receiver according to claim 2 wherein the phase of the pseudonoise signal is changed more frequently than the phase of the regenerated carrier wave.

4. A GPS receiver comprising:
   pseudonoise generator means for simultaneously generating pseudonoise signals respectively corresponding to satellite electromagnetic waves transmitted from two or more satellites;
   oscillator means for simultaneously regenerating carrier waves of the plurality of satellite electric waves; and
   a plurality of demodulator means responsive to said regenerated carrier waves and said pseudonoise signals to demodulate individual satellite electromagnetic waves independently, to thereby regenerate data transmitted from individual satellites;
   said receiver further comprising control means for supplying a clock signal of fixed period to said pseudonoise generator means, delivering a phase of pseudonoise code which is quantized and complies the data, calculating a phase of the pseudonoise signal relative to the satellite electromagnetic wave with an accuracy of less than a quantization step of the phase quantization, on the basis of a correlation of an output signal of said demodulator means to the satellite electromagnetic wave, and numerically tracking individual pseudonoise codes specific to individual satellites.

5. A GPS receiver according to claim 4 wherein each demodulator has a linear output amplitude to input amplitude characteristic and the phase of pseudonoise code is calculated on the basis of the linear characteristic.

6. A GPS receiver according to claim 4, wherein said pseudonoise generator means comprises a memory stored with pseudonoise codes and an address generator for generating addresses for the stored pseudonoise codes sequentially and recursively, whereby an initial value is set for an address generated by said address generator to generate a pseudonoise code having a phase complying the initial value.

7. A GPS receiver comprising:
   pseudonoise generator means for simultaneously generating pseudonoise signals respectively corresponding to satellite electromagnetic waves transmitted from two or more satellites;
   oscillator means for simultaneously regenerating carrier waves of the plurality of satellite electromagnetic waves; and a plurality of demodulator means responsive to said regenerated carrier waves and said pseudonoise signals to demodulate individual satellite electromagnetic waves independently, to thereby regenerate data transmitted from individual satellites;

each demodulator being operative, during demodulation, to determine a set of correlations of one pseudonoise signal and one regenerated carrier wave to one satellite electromagnetic wave on time division basis, said receiver further comprising control means for supplying a clock of fixed period to said pseudonoise generator means, delivering a phase of pseudonoise code which is quantized and complies data of the individual satellites, calculating a phase of the pseudonoise signal relative to the satellite electromagnetic wave with an accuracy of less than a quantization step of the phase quantization, on the basis of a result of correlation determined by the demodulator, and numerically tracking individual pseudonoise codes specific to individual satellites.

8. A GPS receiver according to claim 7, wherein each demodulator has a linear output amplitude to input amplitude characteristic and the phase of pseudonoise code is calculated on the basis of the linear characteristic.

9. A GPS receiver according to claim 7, wherein said pseudonoise generator means comprises a memory stored with pseudonoise codes and an address generator for generating addresses for the stored pseudonoise codes sequentially and recursively, whereby an initial value is set for an address generated by said address generator to generate a pseudonoise code having a phase complying the initial value.

10. A GPS receiver according to claim 7, wherein the phase of the pseudonoise signal generated from said pseudonoise generator means is changed to a center phase, a leading phase and a lagging phase, the phase of the regenerated carrier wave is sequentially changed to an in-phase and a quadrature phase at said center phase, and transition of data is transmitted from the satellite at timed relationship with the vicinity of the center of a period during which the phase of the pseudonoise signal takes the center phase and the phase of the regenerated carrier wave takes the in-phase.

11. A GPS receiver according to claim 10, wherein the phase of the pseudonoise signal is changed more frequently than the phase of the regenerated carrier wave.

* * * * *